United States Patent
Chen et al.

(10) Patent No.: US 9,116,389 B2
(45) Date of Patent: Aug. 25, 2015

(54) DISPLAY DEVICE

(71) Applicant: AU Optronics Corp., Hsin-Chu (TW)

(72) Inventors: Kuei-Bai Chen, Hsin-Chu (TW);
Chia-Hao Li, Hsin-Chu (TW);
Chen-Hsien Liao, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 59 days.

(21) Appl. No.: 13/907,976

(22) Filed: Jun. 3, 2013

(65) Prior Publication Data
US 2014/0176857 A1    Jun. 26, 2014

(30) Foreign Application Priority Data
Dec. 21, 2012 (TW) .............................. 101149137 A

(51) Int. Cl.
| | | |
|---|---|---|
| G02F 1/1335 | (2006.01) | |
| C09K 11/08 | (2006.01) | |
| C09K 11/77 | (2006.01) | |
| H01L 33/50 | (2010.01) | |
| G02B 5/20 | (2006.01) | |
| G02B 5/22 | (2006.01) | |

(52) U.S. Cl.
CPC ...... *G02F 1/133621* (2013.01); *C09K 11/0811* (2013.01); *C09K 11/773* (2013.01); *G02B 5/201* (2013.01); *G02B 5/223* (2013.01); *G02F 1/133514* (2013.01); *G02F 1/133603* (2013.01); *H01L 33/50* (2013.01); *G02F 2001/133614* (2013.01); *H01L 33/504* (2013.01); *H01L 33/507* (2013.01)

(58) Field of Classification Search
None
See application file for complete search history.

(56) References Cited

U.S. PATENT DOCUMENTS

| | | | |
|---|---|---|---|
| 7,906,041 B2 * | 3/2011 | Li et al. ................... | 252/301.4 F |
| 8,098,005 B2 | 1/2012 | Kwak | |
| 8,223,300 B2 * | 7/2012 | Yang et al. .................... | 349/106 |
| 2010/0142189 A1 | 6/2010 | Hong | |
| 2011/0182072 A1 | 7/2011 | Shimizu | |
| 2012/0250351 A1 * | 10/2012 | Shin et al. ..................... | 362/608 |
| 2014/0045106 A1 | 2/2014 | Fujita | |

FOREIGN PATENT DOCUMENTS

| | | |
|---|---|---|
| CN | 102738358 A | 10/2012 |
| TW | 201247787 A1 | 12/2012 |

* cited by examiner

*Primary Examiner* — Richard Kim
(74) *Attorney, Agent, or Firm* — Winston Hsu; Scott Margo

(57) ABSTRACT

A display device includes at least one light-emitting device and a color filter pattern. The light-emitting device is used to emit a white light having a white point chromaticity coordinates (Wx, Wy), where $0.228<Wx<0.278$ and $0.186<Wy<0.315$. The color filter pattern includes red, green and blue color filters. The peak wavelength of the red color filter is in a range of 725 nm to 780 nm, and its relative intensity is in a range of 0.95 to 1. The peak wavelength of the green color filter is $517\pm2$ nm, and its relative intensity of the peak wavelength is in a range of 0.72 to 0.77. The peak wavelength of the blue color filter is $454\pm2$ nm, and its relative intensity is in a range of 0.8 to 0.85.

13 Claims, 10 Drawing Sheets

DISPLAY DEVICE

BACKGROUND OF THE INVENTION

1. Field of the Invention

The present disclosure relates to a display device, and more particularly, to a display device with Adobe RGB coverage of the color space over 99%.

2. Description of the Prior Art

A color space describes the range of colors that a display device can display. The common color space standard is sRGB (standard RGB) color space defined by the International Electrotechnical Commission (IEC) and Adobe RGB color space defined by Adobe. Generally, the higher the color space and the color space coverage of the display device are, the better the color reproducibility is. To a liquid crystal display device, the color performance mainly depends on the coordinated results of the light spectrum and the transmission spectrum of color filters. As display technology develops rapidly, the display device is not limited to a monitor or a TV and, thus, the demand for extreme color performance increases. Accordingly, to improve the restricted color space of the current techniques is a significant objective in the field.

SUMMARY OF THE INVENTION

It is one of the objectives of the disclosure to provide a display device with high color reproducibility.

An embodiment of the disclosure provides a display device. The display device includes at least one light-emitting device and a color filter pattern. The light-emitting device is used to provide a white light having a white point chromaticity coordinates (Wx, Wy), where $0.228 < Wx < 0.278$ and $0.186 < Wy < 0.315$. The color filter pattern includes a red color filter, a green color filter and a blue color filter. The red color filter is employed to convert the white light to a red light after the white light passes through the red color filter. The peak wavelength of a transmission spectrum of the red color filter is substantially in a range of 725 nm to 780 nm. The relative intensity of the peak wavelength of the transmission spectrum of the red color filter is substantially in a range of 0.95 to 1. The green color filter is employed to convert the white light to a green light after the white light passes through the green color filter. The peak wavelength of a transmission spectrum of the green color filter is substantially $517 \pm 2$ nm. The relative intensity of the peak wavelength of the transmission spectrum of the green color filter is substantially in a range of 0.72 to 0.77. The blue color filter is employed to convert the white light to a blue light after the white light passes through the blue color filter. The peak wavelength of a transmission spectrum of the blue color filter is substantially $454 \pm 2$ nm. The relative intensity of the peak wavelength of the transmission spectrum of the blue color filter is substantially in a range of 0.8 to 0.85.

Because both the color filter of the display device and the light-emitting device in the present disclosure meet the aforementioned specification, Adobe RGB coverage of the display images is greater than 99% and color reproducibility is above expectation.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present disclosure, features of the embodiments will be made in detail. The embodiments of the present disclosure are illustrated in the accompanying drawings with numbered elements.

Figure 1:
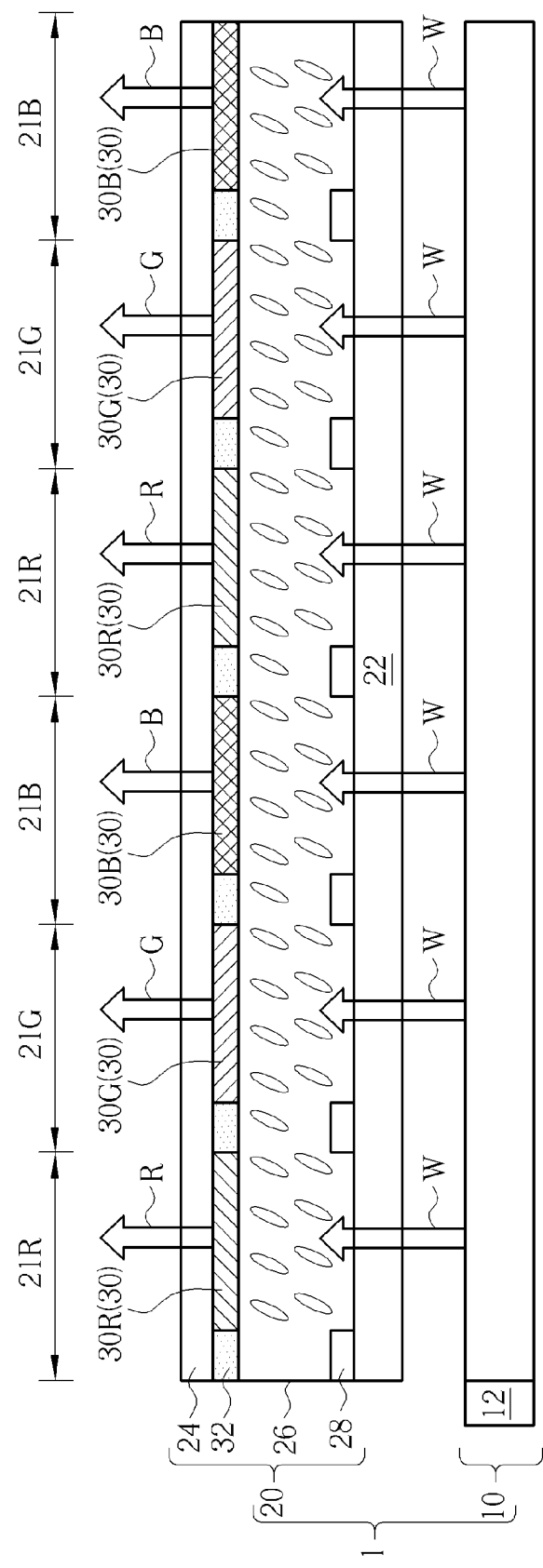
FIG. 1 is a schematic diagram illustrating a display device according to the present disclosure.
Figure 2:
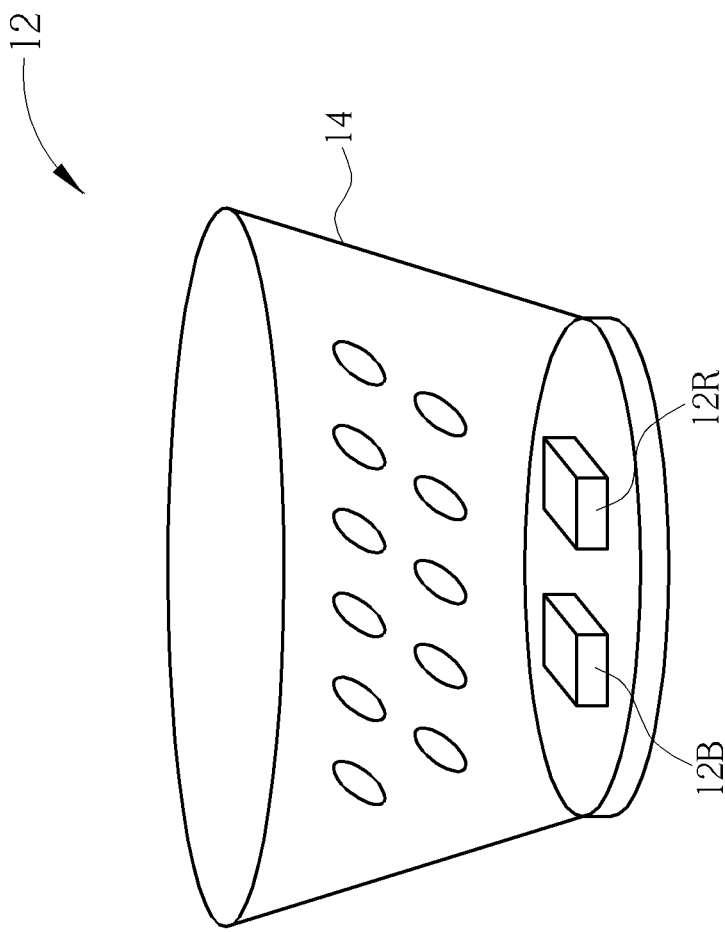
FIG. 2 is a schematic diagram illustrating a light-emitting device according to the present disclosure.

Please refer to FIGS. 1-2. FIG. 1 is a schematic diagram illustrating a display device according to the present disclosure. FIG. 2 is a schematic diagram illustrating a light-emitting device according to the present disclosure. The display device in this embodiment is a non-self-luminous display device, such as a liquid crystal display device, but not limited thereto. The display device of this embodiment may be other suitable display devices. As shown in FIG. 1, the display device 1 in this embodiment includes a backlight module 10 and a display panel 20. The backlight module 10 is disposed beneath the display panel 20. The backlight module 10 includes at least one light-emitting device 12 to provide white light W to the display panel 20. The white point chromaticity coordinate of the white light W is (Wx, Wy), and the white point chromaticity coordinate satisfies the following relation: $0.228 < Wx < 0.278$ and $0.186 < Wy < 0.315$. The display panel 20 in this embodiment is a non-self-luminous display panel, such as a liquid crystal display panel, but not limited thereto. The display panel 20 includes a array substrate 22, an opposing substrate 24, a plurality of red sub-pixels 21R, a plurality of green sub-pixels 21G, a plurality of blue sub-pixels 21B, a display media layer 26, a plurality of active switching device 28, a color filter pattern 30 and a light blocking pattern 32. The array substrate 22 faces the opposing substrate 24. The display media layer 26, such as a liquid crystal layer, is disposed between the array substrate 22 and the opposing substrate 24. The active switching devices 28, which may be, for example, thin film transistor devices, are disposed on the array substrate 22 and respectively locate in the red sub-pixels 21R, the green sub-pixels 21G and the blue sub-pixels 21B. The color filter pattern 30 and the light blocking pattern 32 are disposed on the opposing substrate 24. In another embodiment, both the color filter pattern 30 and the light blocking pattern 32 may be disposed on the array substrate 22 as well. The color filter pattern 30 includes a red color filter 30R disposed in each of the red sub-pixels 21R, a green color filter 30G disposed in each of the green sub-pixels 21G, and a blue color filter 30B disposed in each of the blue sub-pixels 21B. The red color filter 30R is employed to convert white light W to a red light R after the white light W passes through the red color filter 30R. The green color filter 30G is employed to convert white light W to a green light G after the white light W passes through the green color filter 30G. The blue color filter 30B is employed to convert white light W to a blue light B after the white light W passes through the blue color filter 30B. With the red light R, the green light G and the blue light B passing through the color filter pattern 30, a full color image is displayed. The light blocking pattern 32, such as a black matrix pattern, is disposed among the red color filters 30R, the green color filters 30G and the blue color filters 30B which are adjacent to one another so as to prevent light leakage. The display panel 20 may further include other necessary display devices (not shown) for implementing its display function such as a gate line, a data line, a pixel electrode, a common electrode, a storage capacitor line, a storage capacitor, an alignment film, a polarizer and other required devices. Since the function and the arrangement of the aforementioned display devices are well known to those skilled in the art, they are not redundantly described.

In this embodiment, the white point chromaticity coordinate of the white light W emitted from the light-emitting device 12 is (Wx, Wy) which satisfies the following relation: $0.228 < Wx < 0.278$ and $0.186 < Wy < 0.315$. Moreover, there are three peaks in the spectrum of the white light W emitted from the light-emitting device 12. The peak wavelength of the blue light spectrum is substantially in a range of 447 nanometers (nm) to 451 nm, and the full width at half maximum (FWHM) of the blue light spectrum is substantially in a range of 20 nm to 25 nm. The peak wavelength of the green light spectrum is substantially in a range of 529 nm to 533 nm, and the full width at half maximum of the green light spectrum is substantially in a range of 35 nm to 45 nm. The peak wavelength of the red light spectrum is substantially in a range of 637 nm to 641 nm, and the full width at half maximum of the red light spectrum is substantially in a range of 18 nm to 24 nm.

As shown in FIG. 2, the light-emitting device 12 in the present disclosure may include a white light-emitting diode device. The light-emitting device 12 preferably includes a blue light-emitting diode chip 12B, a red light-emitting diode chip 12R and a green phosphor 14. The blue light-emitting diode chip 12B emits the blue light. The red light-emitting diode chip 12R emits the red light. The green phosphor 14 converts a portion of the blue light emitted by the blue light-emitting diode chip 12B to the green light G. The white light is obtained by mixing the red light, the blue light and the green light. The material of the green phosphor 14 comprises a sulfide-based phosphor material. The sulfide-based phosphor material comprises Eu doped calcium sulfide (CaS:Eu), zinc sulfide (ZnS) and mixtures thereof. For example, if the sulfide-based phosphor material is the mixtures of CaS:Eu and ZnS, the mass fraction of ZnS is substantially in a range of 7.8% to 21.8%. Because the mass fraction of ZnS is defined as the fraction of the mass of ZnS to the mass of the total mixture, the mass fraction of CaS:Eu is substantially in a range of 78.2% to 92.2%. However, the present disclosure is not limited to this and, in other embodiments, the ratio of CaS:Eu and ZnS can be further modified and other materials may be added in. Moreover, the sulfide-based phosphor material for the green phosphor 14 may be other suitable materials or mixtures. Even more, the material of green phosphors may not be limited to the sulfide-based phosphor material but may be other suitable phosphor materials.

Figure 3:
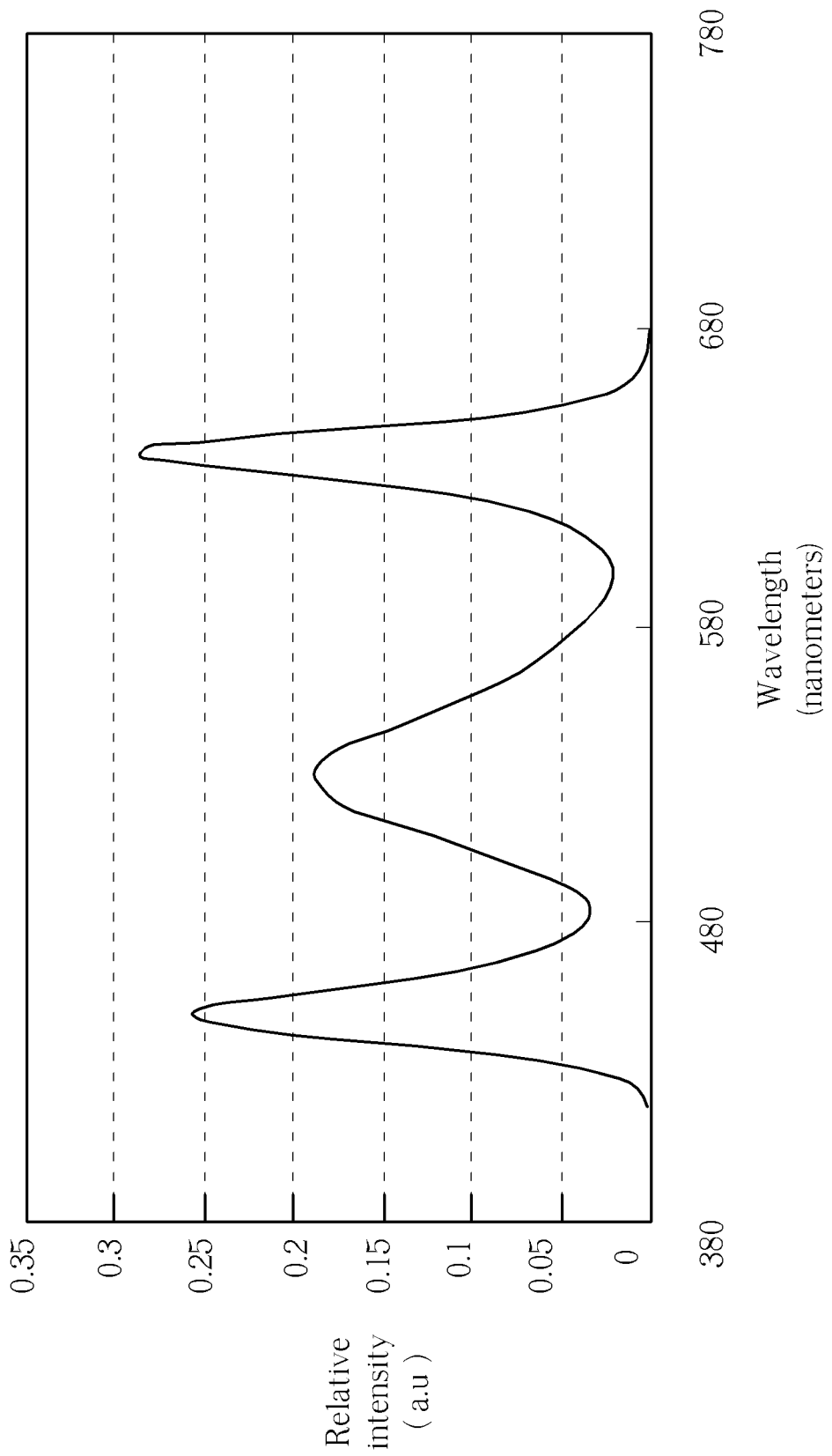
FIG. 3 is a spectrum of the white light emitted from the light-emitting device of sample 1 in this embodiment.
Figure 4:
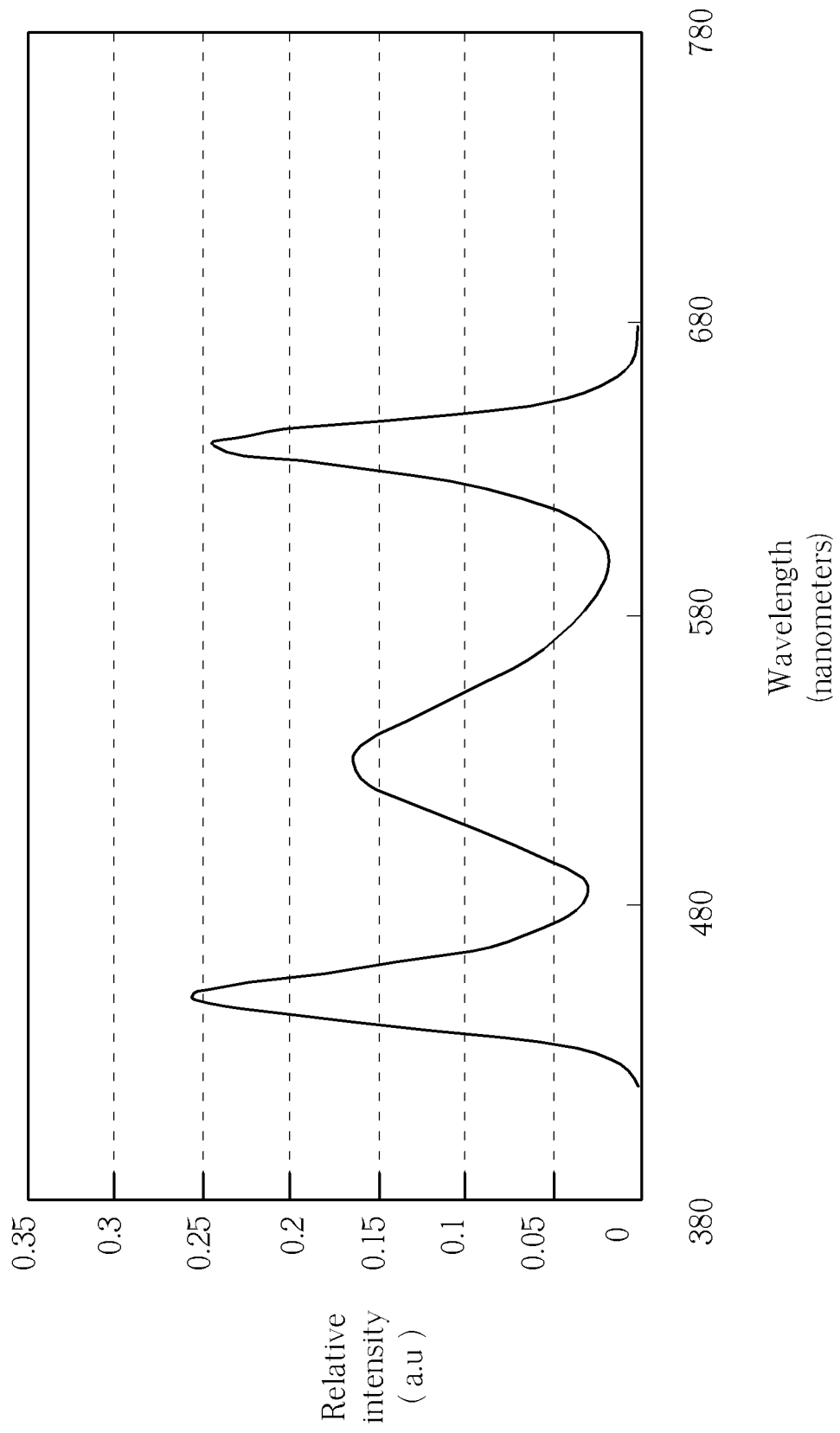
FIG. 4 is a spectrum of the white light emitted from the light-emitting device of sample 2 in this embodiment.
Figure 5:
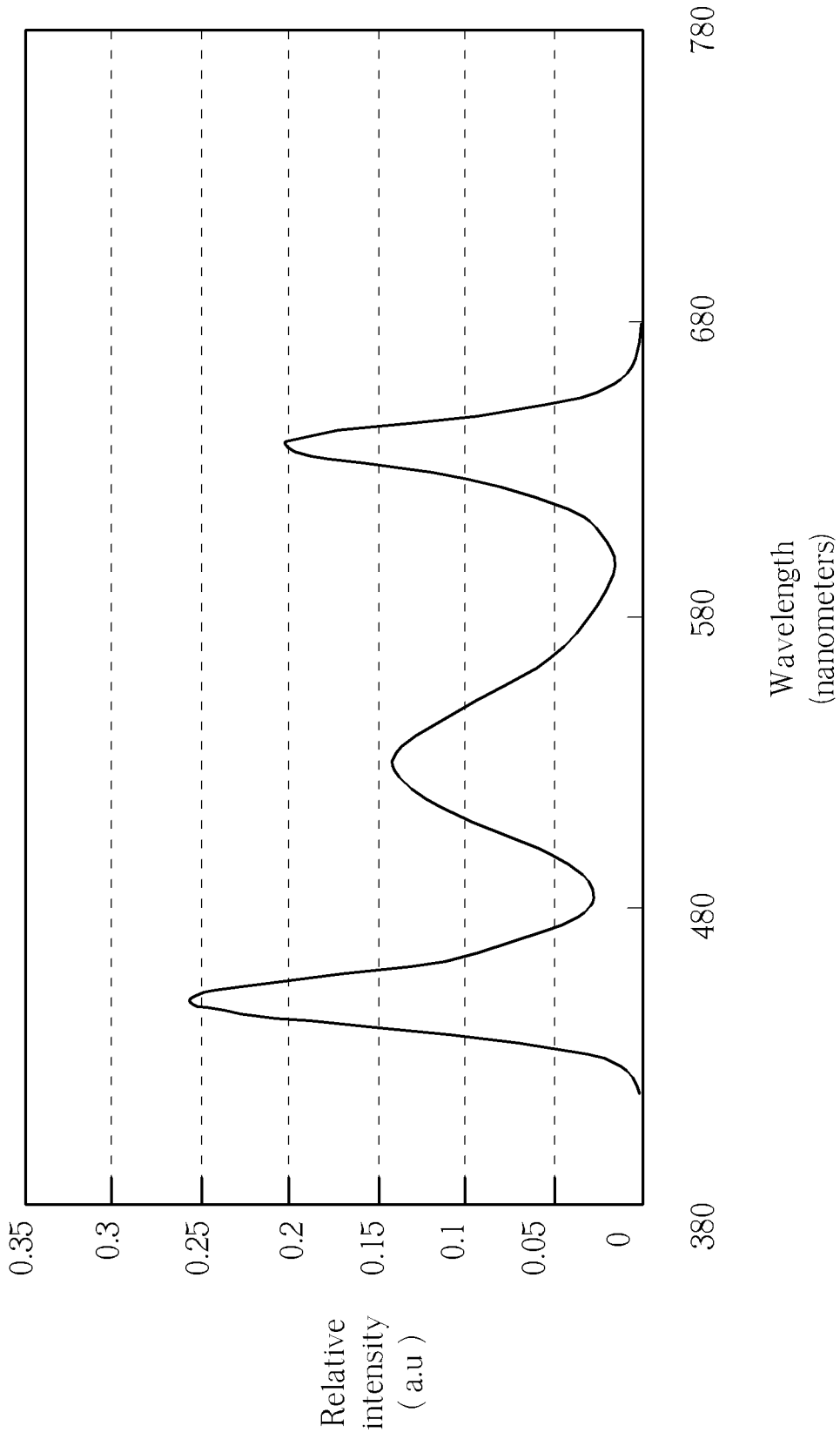
FIG. 5 is a spectrum of the white light emitted from the light-emitting device of sample 3 in this embodiment.
Figure 6:
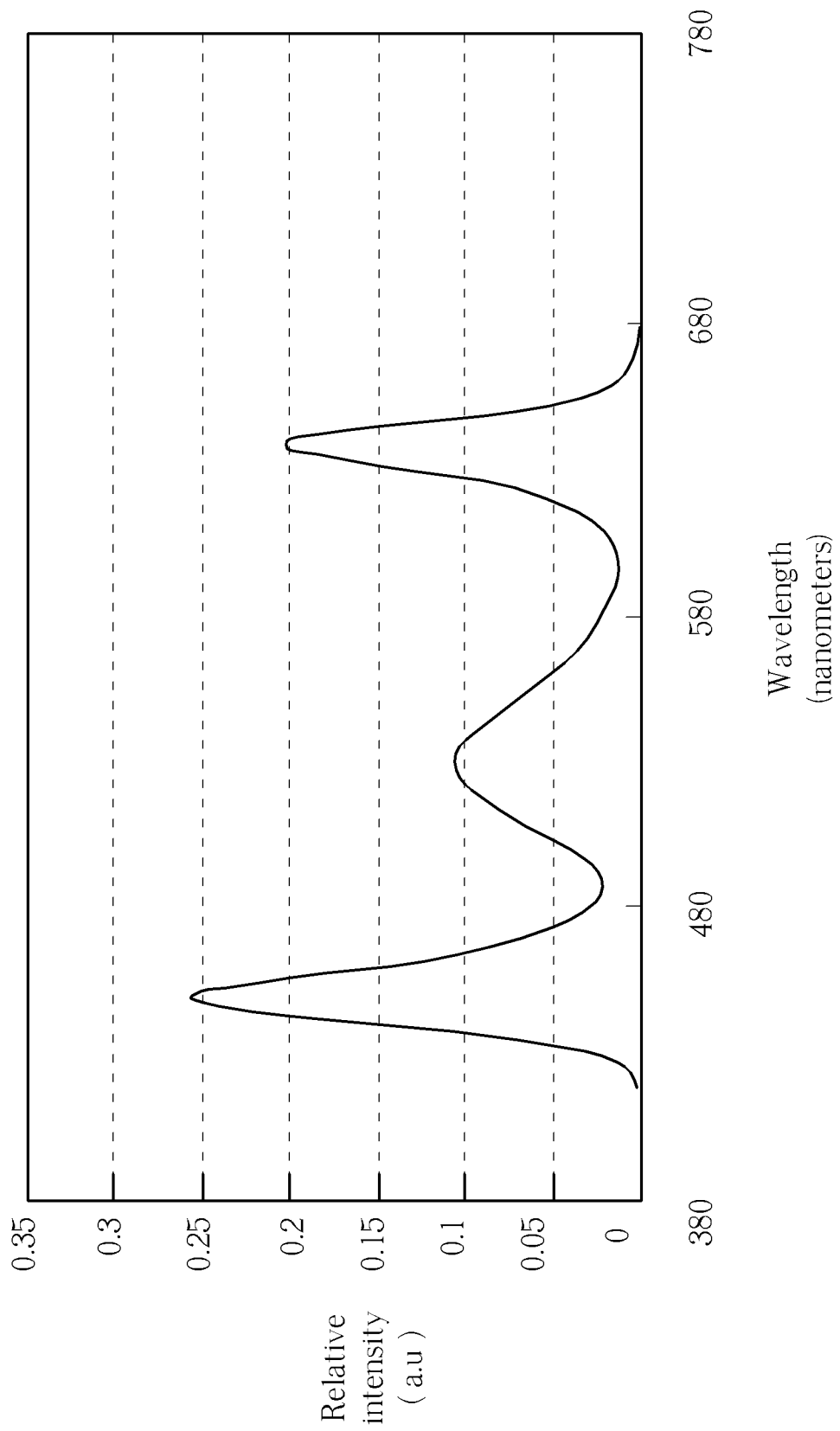
FIG. 6 is a spectrum of the white light emitted from the light-emitting device of sample 4 in this embodiment.
Figure 7:
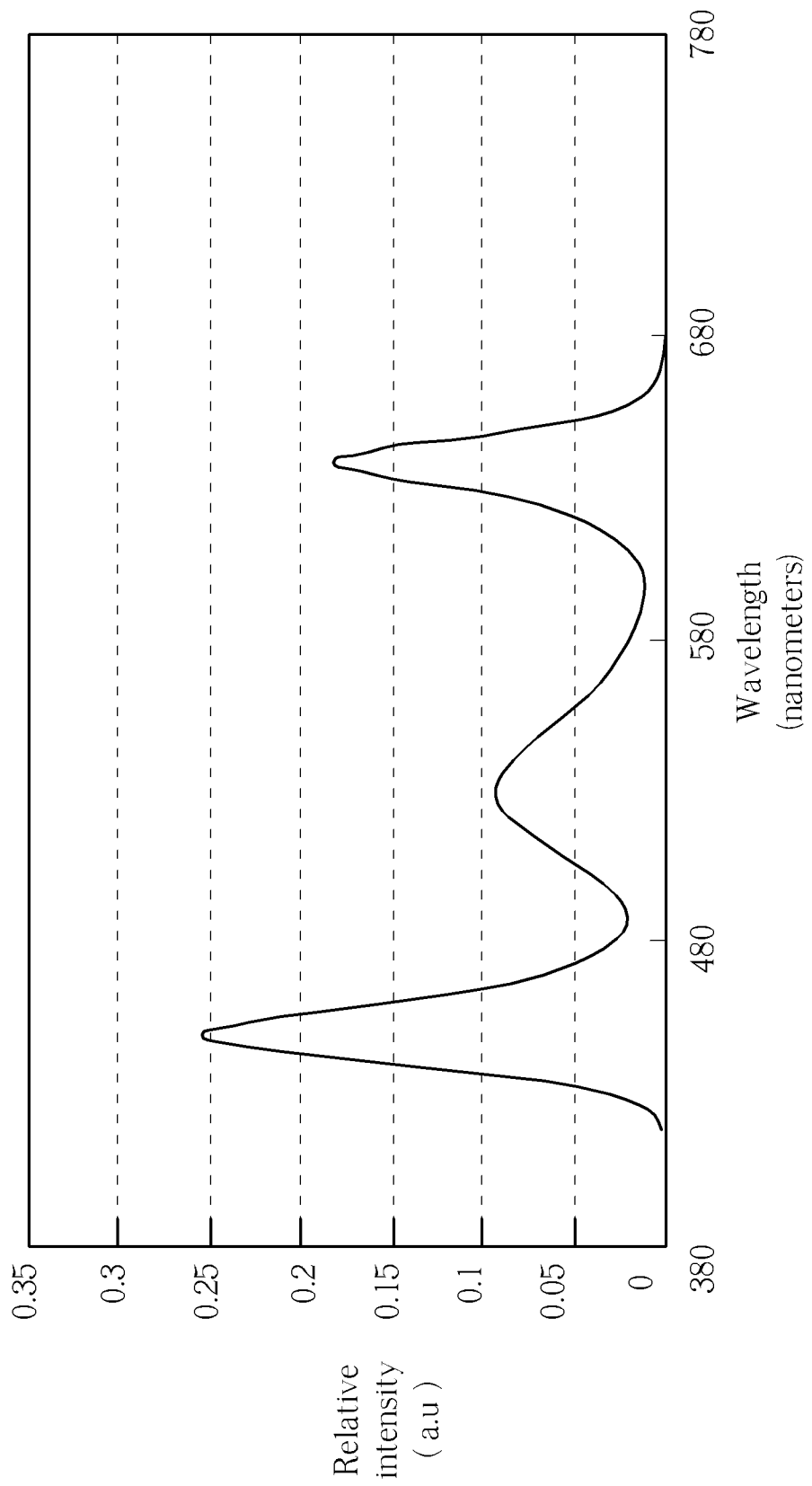
FIG. 7 is a spectrum of the white light emitted from the light-emitting device of sample 5 in this embodiment.
Figure 8:
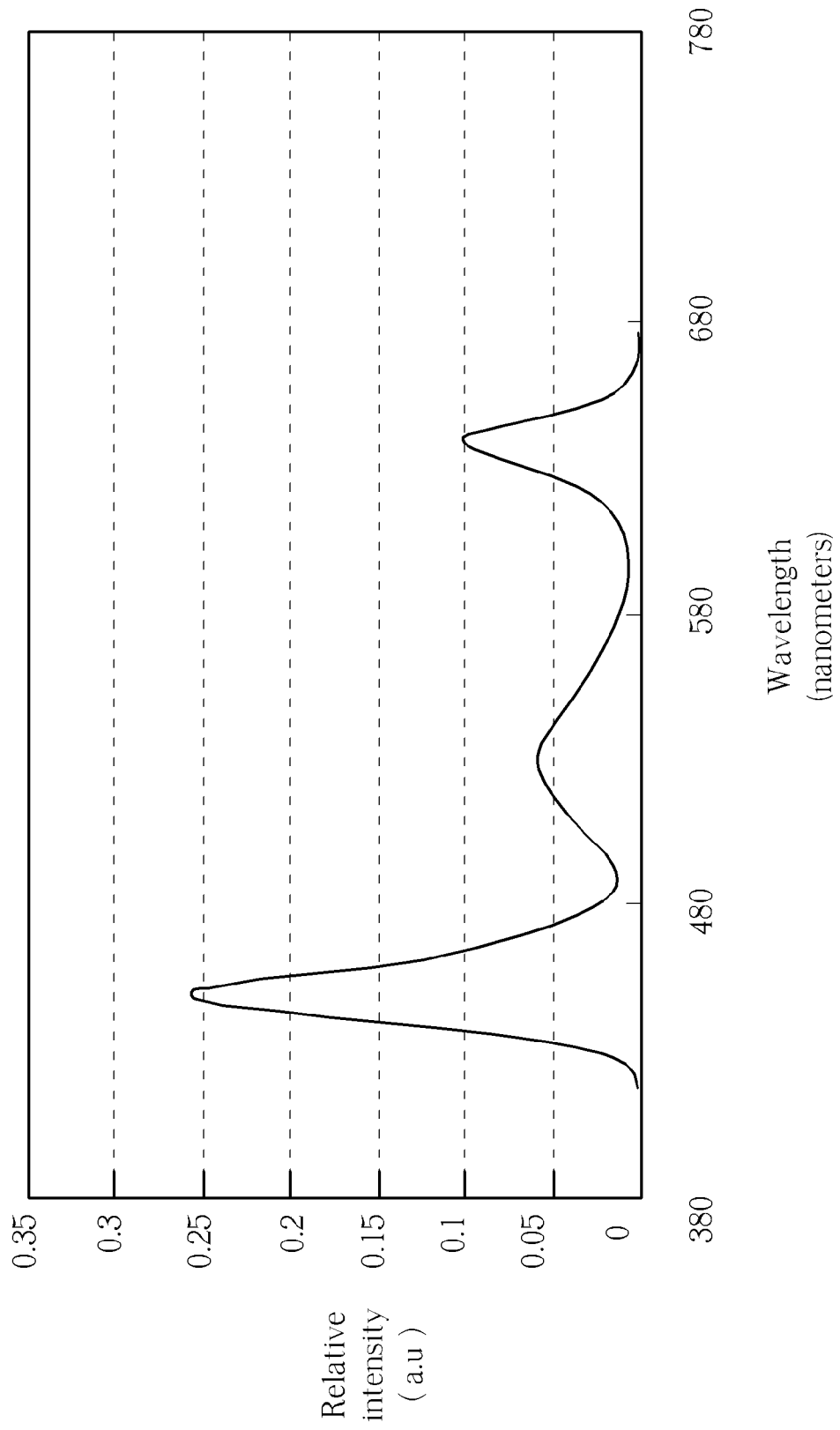
FIG. 8 is a spectrum of the white light emitted from the light-emitting device of sample 6 in this embodiment.
Figure 9:
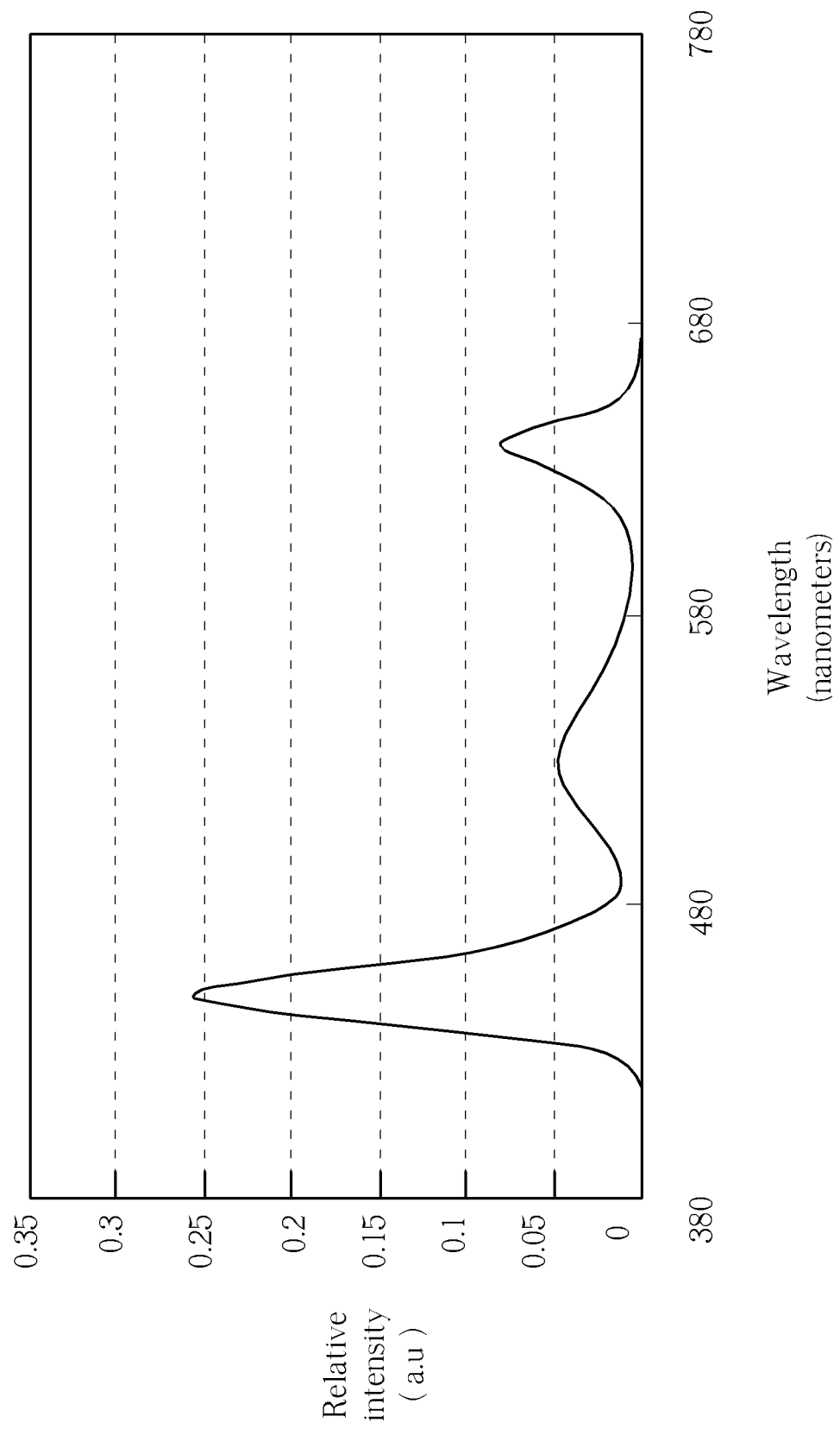
FIG. 9 is a spectrum of the white light emitted from the light-emitting device of sample 7 in this embodiment.

Please refer to Table 1 and also refer to FIGS. 3-9. Several samples of the light-emitting device of this embodiment are listed in Table 1 below. Table 1 also presents the coordinated results of the mass fraction of ZnS of the green phosphor and the operating current for both the blue light-emitting diode chip and the red light-emitting diode chip in the samples. FIG. 3 is a spectrum of the white light emitted from the light-emitting device of sample 1 in this embodiment. FIG. 4 is a spectrum of the white light emitted from the light-emitting device of sample 2 in this embodiment. FIG. 5 is a spectrum of the white light emitted from the light-emitting device of sample 3 in this embodiment. FIG. 6 is a spectrum of the white light emitted from the light-emitting device of sample 4 in this embodiment. FIG. 7 is a spectrum of the white light emitted from the light-emitting device of sample 5 in this embodiment. FIG. 8 is a spectrum of the white light emitted from the light-emitting device of sample 6 in this embodiment. FIG. 9 is a spectrum of the white light emitted from the light-emitting device of sample 7 in this embodiment.

TABLE 1

|  | The operating current for the blue light-emitting diode chip (mA) | the mass fraction of ZnS | The operating current for the red light-emitting diode chip (mA) | the white point chromaticity coordinates | |
|---|---|---|---|---|---|
|  |  |  |  | Wx | Wy |
| Sample 1 | 90 | 24.9% | 98 | 0.287 | 0.332 |
| Sample 2 | 90 | 21.8% | 84 | 0.278 | 0.315 |
| Sample 3 | 90 | 18.7% | 70 | 0.267 | 0.295 |
| Sample 4 | 90 | 14.0% | 70 | 0.268 | 0.258 |
| Sample 5 | 90 | 12.4% | 63 | 0.262 | 0.243 |
| Sample 6 | 90 | 7.8% | 35 | 0.228 | 0.186 |
| Sample 7 | 90 | 6.2% | 28 | 0.217 | 0.162 |

The sulfide-based phosphor material used in the light-emitting devices of samples 1-7 is the mixtures of CaS:Eu and ZnS but each mass fraction is different from the other. From the experimental results shown in Table 1, the mass fraction of ZnS is substantially in a range of 7.8% to 21.8%. The mass fraction of CaS:Eu is substantially in a range of 78.2% to 92.2%. Within the aforementioned concentration, the white point chromaticity coordinates (Wx, Wy) of the white light emitted from the light-emitting devices satisfy the following relation: $0.228 < Wx < 0.278$ and $0.186 < Wy < 0.315$, which meets the required specification of the white light in the display device in this embodiment.

Figure 10:
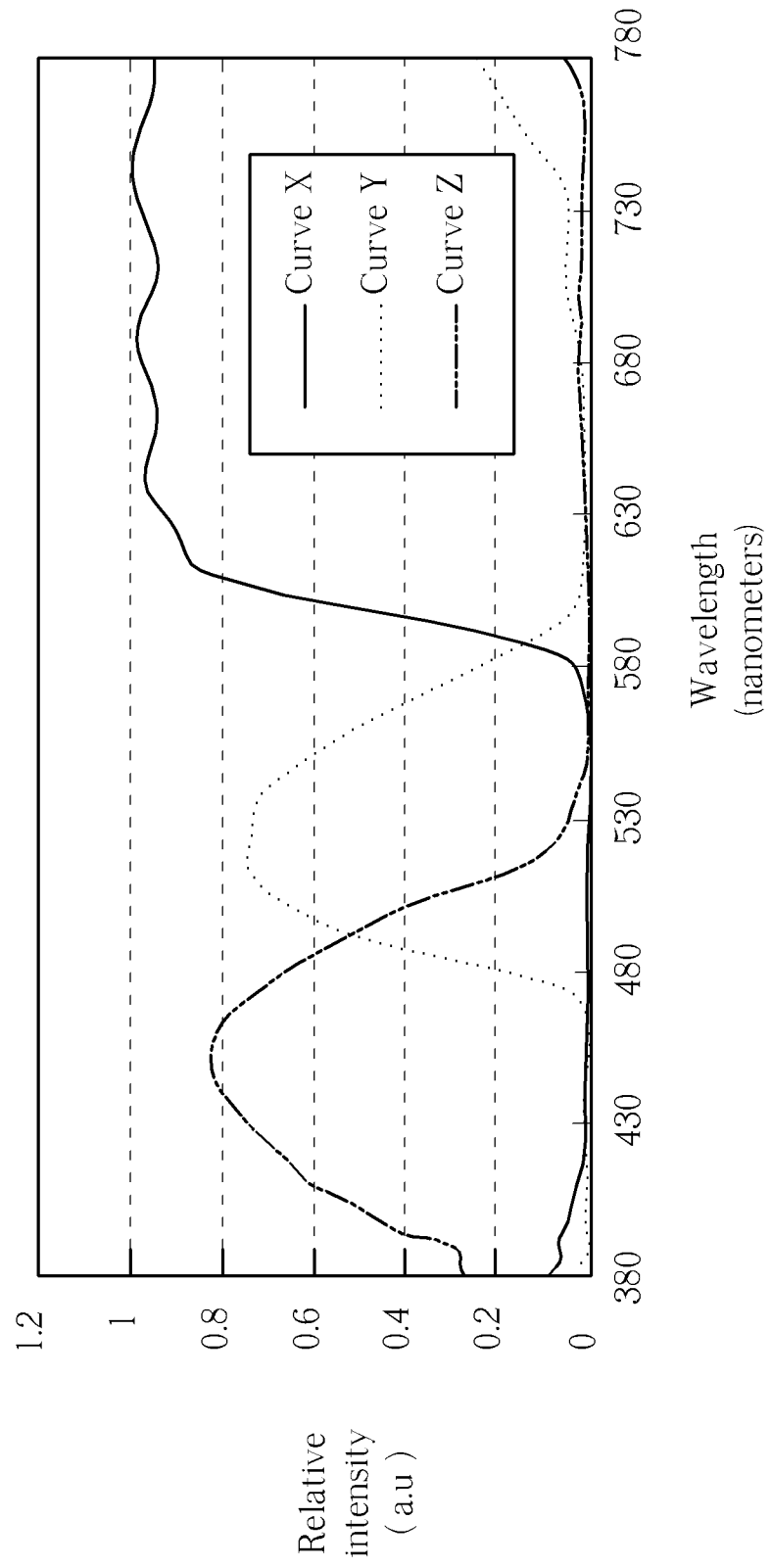
FIG. 10 is a transmission spectrum of the color filter pattern according to an embodiment of the present disclosure.

Please refer to FIG. 10, and also refer to FIG. 1. FIG. 10 is a transmission spectrum of the color filter pattern according to an embodiment of the present disclosure. As shown in FIG. 10, the curve X presents a transmission spectrum of the red color filter 30R. The peak wavelength of the transmission spectrum of the red color filter 30R is substantially in a range of 725 nm to 780 nm. The relative intensity of the peak wavelength of the transmission spectrum of the red color filter 30R is substantially in a range of 0.95 to 1. The curve Y presents a transmission spectrum of the green color filter 30G. The peak wavelength of the transmission spectrum of the green color filter 30G is substantially 517±2 nm. The full width at half maximum of the green light spectrum is substantially in a range of 86 nm to 90 nm. The relative intensity of the peak wavelength of the transmission spectrum of the green color filter 30G is substantially in a range of 0.72 to 0.77. The curve Z presents a transmission spectrum of the blue color filter 30B. The peak wavelength of the transmission spectrum of the blue color filter 30B is substantially 454±2 nm. The full width at half maximum of the blue light spectrum is substantially in a range of 102 nm to 107 nm. The relative intensity of the peak wavelength of the transmission spectrum of the blue color filter 30B is substantially in a range of 0.8 to 0.85.

In this embodiment, the material of the red color filter 30R may comprise Diketo-pyrrolopyrrole (DPP) dyes (as shown in the following chemical formula (1)), Anthraquinone dyes (as shown in the following chemical formula (2)), or mixtures thereof (1)

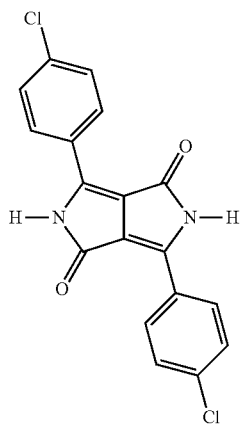

(2)

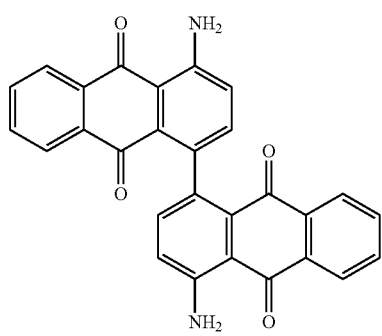

The material of the red color filter 30R is not limited to the preceding materials and may be other materials which let only red light through. Moreover, the exact ratio of Diketopyrrolopyrrole (DPP) dyes and Anthraquinone dyes may be further modified according to design considerations.

The material of the blue color filter 30B may comprise Phthalocyanine dyes (as shown in the following chemical formula (3)), Anthraquinone dyes (as shown in the following chemical formula (4)), or mixtures thereof.

(3)

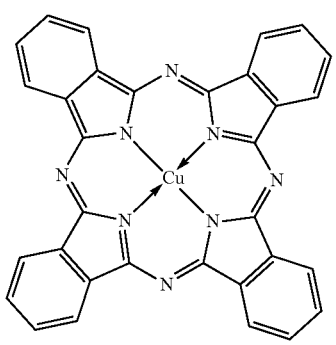

(4)

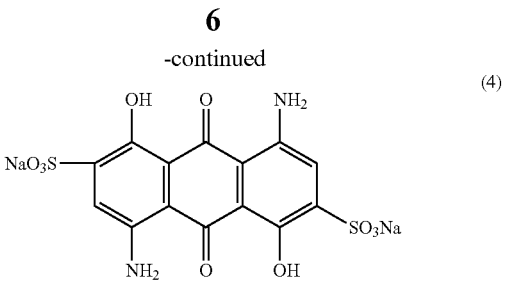

The material of the blue color filter 30B is not limited to the preceding materials and may be other materials which let only blue light through. Moreover, the exact ratio of Phthalocyanine dyes and Anthraquinone dyes may be further modified according to design considerations.

The material of the green color filter 30G may comprise mixtures of Azo metal complex dyes and Halogen-Phthalocyanine dyes. For example, the material of the green color filter 30G may comprise, for example, Azo metal complex dyes (as shown in the following chemical formula (5)), Chlorine Bromine-Phthalocyanine dyes (as shown in the following chemical formula (6)), Chlorine-Phthalocyanine dyes (as shown in the following chemical formula (7)), or mixture thereof.

(5)

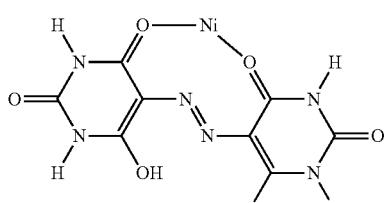

(6)

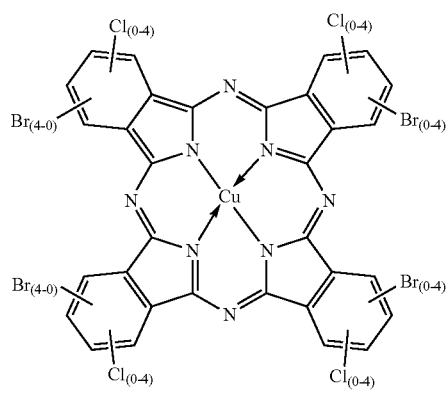

(7)

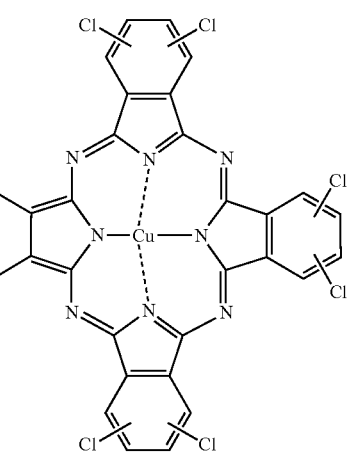

The material of the green color filter 30G is not limited to the preceding materials and may be other materials which let only green light through. Moreover, the exact ratio of Azo metal complex dyes, Chlorine Bromine-Phthalocyanine dyes and Chlorine-Phthalocyanine dyes may be further modified according to design considerations.

Please refer to Table 2-1 and Table 2-2, and also refer to Table 1. Coordinates in the color space of the display images on the display device of this embodiment, such as red point chromaticity coordinates, green point chromaticity coordinates, blue point chromaticity coordinates and white point chromaticity coordinates, National Television System Committee (NTSC) color space coverage (also referred to as NTSC coverage), Adobe RGB color space coverage (also referred to as Adobe RGB coverage) are listed in Table 2-1 and Table 2-2. According to Adobe RGB color space standard defined by Adobe, the red point chromaticity coordinate is (0.64, 0.33). The green point chromaticity coordinate is (0.21, 0.71). The blue point chromaticity coordinate is (0.15, 0.05). The white point chromaticity coordinates of the white light W emitted from the light-emitting devices of the samples 1-7 are (Wx, Wy) which satisfy the following relation: $0.228<Wx<0.278$ and $0.186<Wy<0.315$ (as shown in Table 1). Therefore, Adobe RGB coverage of the color space of the display images on the display devices in samples 1-7 is greater than 99% (as shown in Table 2-2).

TABLE 2-1

|  | the red point chromaticity coordinates | | | the green point chromaticity coordinates | | |
| --- | --- | --- | --- | --- | --- | --- |
|  | x | y | Y | x | y | Y |
| Sample 1 | 0.696 | 0.298 | 2.01 | 0.210 | 0.716 | 7.85 |
| Sample 2 | 0.695 | 0.298 | 1.97 | 0.209 | 0.715 | 7.84 |
| Sample 3 | 0.694 | 0.298 | 1.92 | 0.209 | 0.714 | 7.83 |
| Sample 4 | 0.696 | 0.296 | 2.35 | 0.209 | 0.712 | 7.40 |
| Sample 5 | 0.695 | 0.296 | 2.35 | 0.209 | 0.711 | 7.34 |
| Sample 6 | 0.690 | 0.294 | 2.09 | 0.208 | 0.707 | 7.26 |
| Sample 7 | 0.688 | 0.293 | 2.05 | 0.208 | 0.703 | 7.11 |

TABLE 2-2

|  | the blue point chromaticity coordinates | | | the white point chromaticity coordinates | | | NTSC (%) | Adobe RGB (%) |
| --- | --- | --- | --- | --- | --- | --- | --- | --- |
|  | x | y | Y | x | y | Y |  |  |
| Sample 1 | 0.144 | 0.082 | 1.09 | 0.287 | 0.352 | 3.65 | 106.09 | 98.8 |
| Sample 2 | 0.145 | 0.075 | 1.13 | 0.278 | 0.336 | 3.65 | 106.72 | 99.3 |
| Sample 3 | 0.146 | 0.069 | 1.18 | 0.268 | 0.316 | 3.64 | 107.30 | 99.7 |
| Sample 4 | 0.147 | 0.058 | 1.23 | 0.274 | 0.278 | 3.66 | 108.67 | 100 |
| Sample 5 | 0.148 | 0.055 | 1.28 | 0.268 | 0.263 | 3.66 | 108.90 | 100 |
| Sample 6 | 0.149 | 0.044 | 1.57 | 0.233 | 0.204 | 3.64 | 108.63 | 99.7 |
| Sample 7 | 0.150 | 0.040 | 1.74 | 0.221 | 0.179 | 3.63 | 108.14 | 99.0 |

To sum up, the white point chromaticity coordinates (Wx, Wy) of the white light emitted from the light-emitting devices of samples 2-6 satisfy the following relation: $0.228<Wx<0.278$ and $0.186<Wy<0.315$. The peak wavelength of the transmission spectrum of the red color filter is substantially in a range of 725 nm to 780 nm. The relative intensity of the peak wavelength of the transmission spectrum of the red color filter is substantially in a range of 0.95 to 1. The peak wavelength of the transmission spectrum of the green color filter is substantially $517\pm2$ nm. The full width at half maximum of the green light spectrum is substantially in a range of 86 nm to 90 nm. The relative intensity of the peak wavelength of the transmission spectrum of the green color filter is substantially in a range of 0.72 to 0.77. The peak wavelength of the transmission spectrum of the blue color filter is substantially $454\pm2$ nm. The full width at half maximum of the blue light spectrum is substantially in a range of 102 nm to 107 nm. The relative intensity of the peak wavelength of the transmission spectrum of the blue color filter is substantially in a range of 0.8 to 0.85. Because both the color filter of the display device and the light-emitting device in the present disclosure meet the aforementioned specification, Adobe RGB coverage of the display images is greater than 99% and color reproducibility is above expectation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device, comprising:
    at least one light-emitting device, configured to provide a white light, wherein the white light has a white point chromaticity coordinate (Wx, Wy), wherein $0.228<Wx<0.278$ and $0.186<Wy<0.315$; and a color filter pattern, comprising:
        a red color filter, configured to convert the white light to a red light after the white light passes through the red color filter, wherein a peak wavelength of a transmission spectrum of the red color filter is substantially in a range of 725 nanometers (nm) to 780 nm, and a relative intensity of the peak wavelength of the transmission spectrum of the red color filter is substantially in a range of 0.95 to 1;
        a green color filter, configured to convert the white light to a green light after the white light passes through the green color filter, wherein a peak wavelength of a transmission spectrum of the green color filter is substantially $517\pm2$ nm, and a relative intensity of the peak wavelength of the transmission spectrum of the green color filter is substantially in a range of 0.72 to 0.77; and
        a blue color filter, configured to convert the white light to a blue light after the white light passes through the blue color filter, wherein a peak wavelength of a transmission spectrum of the blue color filter is substantially $454\pm2$ nm, and a relative intensity of the peak wavelength of the transmission spectrum of the blue color filter is substantially in a range of 0.8 to 0.85,
    wherein a display image provided by the display device has a white point chromaticity coordinate (Wx', Wy'), where $0.221\leq Wx'\leq 0.287$ and $0.179\leq Wy'\leq 0.352$.

2. The display device according to claim 1, wherein a spectrum of the white light comprises:
    a blue light spectrum, wherein a peak wavelength of the blue light spectrum is substantially in a range of 447 nm to 451 nm, and a full width at half maximum (FWHM) of the blue light spectrum is substantially in a range of 20 nm to 25 nm;
    a green light spectrum, wherein a peak wavelength of the green light spectrum is substantially in a range of 529 nm to 533 nm, and a full width at half maximum of the green light spectrum is substantially in a range of 35 nm to 45 nm; and
    a red light spectrum, wherein a peak wavelength of the red light spectrum is substantially in a range of 637 nm to 641 nm, and a full width at half maximum of the red light spectrum is substantially in a range of 18 nm to 24 nm.

3. The display device according to claim 1, wherein an Adobe RGB color space coverage of a display image formed of the red light, the green light and the blue light is substantially greater than 99%.

4. The display device according to claim 1, wherein the at least one light-emitting device comprises a white light-emitting diode device.

5. The display device according to claim 4, wherein the white light-emitting diode device comprises a blue light-emitting diode chip, a red light-emitting diode chip and a green phosphor.

6. The display device according to claim 5, wherein a material of the green phosphor comprises a sulfide-based phosphor material.

7. The display device according to claim 6, wherein the sulfide-based phosphor material comprises Eu doped calcium sulfide (CaS:Eu), zinc sulfide (ZnS) and mixtures thereof.

8. The display device according to claim 1, wherein a material of the red color filter comprises mixtures of Diketopyrrolopyrrole (DPP) dyes and Anthraquinone dyes.

9. The display device according to claim 1, wherein a material of the blue color filter comprises mixtures of Phthalocyanine dyes and Anthraquinone dyes.

10. The display device according to claim 1, wherein a material of the green color filter comprises mixtures of Azo metal complex dyes and Halogen-Phthalocyanine dyes.

11. The display device according to claim 10, wherein the Halogen-Phthalocyanine dyes comprise Chlorine Bromine-Phthalocyanine dyes and Chlorine-Phthalocyanine dyes.

12. The display device according to claim 1, further comprising a non-self-luminous display panel disposed on the at least one light-emitting device, wherein the color filter pattern is disposed in the non-self-luminous display panel.

13. The display device according to claim 12, wherein the non-self-luminous display panel comprises a liquid crystal display panel.

* * * * *